US008819513B2

(12) United States Patent
Shen et al.

(10) Patent No.: US 8,819,513 B2
(45) Date of Patent: Aug. 26, 2014

(54) LOST REAL-TIME MEDIA PACKET RECOVERY

(75) Inventors: Li Shen, Bellevue, WA (US); Tim Moore, Bellevue, WA (US); Shiwei Wang, Bellevue, WA (US); Tin Qian, Bellevue, WA (US)

(73) Assignee: Microsoft Corporation, Redmond, WA (US)

( * ) Notice: Subject to any disclaimer, the term of this patent is extended or adjusted under 35 U.S.C. 154(b) by 292 days.

(21) Appl. No.: 13/350,731

(22) Filed: Jan. 13, 2012

(65) Prior Publication Data

US 2013/0185614 A1  Jul. 18, 2013

(51) Int. Cl.
*H04L 1/18* (2006.01)

(52) U.S. Cl.
USPC ........................................ 714/748; 714/776

(58) Field of Classification Search
CPC ..................................................... H04L 1/0057
USPC ......................................... 714/748, 751, 752
See application file for complete search history.

(56) References Cited

U.S. PATENT DOCUMENTS

| 5,870,412 | A | * | 2/1999 | Schuster et al. | .............. | 714/752 |
| 6,141,788 | A | * | 10/2000 | Rosenberg et al. | ............ | 714/774 |
| 6,243,846 | B1 | * | 6/2001 | Schuster et al. | .............. | 714/776 |
| 6,421,387 | B1 | | 7/2002 | Rhee | | |
| 6,728,924 | B1 | * | 4/2004 | Lou et al. | ....................... | 714/776 |
| 6,745,364 | B2 | | 6/2004 | Bhatt | | |
| 6,771,674 | B1 | * | 8/2004 | Schuster et al. | .............. | 370/537 |
| 6,785,261 | B1 | * | 8/2004 | Schuster et al. | .............. | 370/352 |
| 7,376,880 | B2 | | 5/2008 | Ichiki | | |
| 7,876,685 | B2 | | 1/2011 | Botzko | | |
| 7,940,777 | B2 | * | 5/2011 | Asati et al. | ............... | 370/395.52 |
| 8,091,011 | B2 | | 1/2012 | Rajakarunanayake | | |
| 8,279,755 | B2 | * | 10/2012 | Luby | ............................ | 370/230 |
| 8,473,833 | B2 | * | 6/2013 | Melliar-Smith et al. | ...... | 714/801 |

(Continued)

FOREIGN PATENT DOCUMENTS

KR  10-2010-0075466 A  7/2010

OTHER PUBLICATIONS

"International Search Report", Mailed Date: Apr. 25, 2013, Application No. PCT/US2013/020717, Filed date: Jan. 9, 2013, 12 Pages.

(Continued)

*Primary Examiner* — Esaw Abraham
(74) *Attorney, Agent, or Firm* — Andrew Smith; Jim Ross; Micky Minhas (57) ABSTRACT

Systems, methods and computer program products for facilitating the recovery of lost real-time media packets within a computer network real-time application implementing Forward Error Control (FEC), such that server performance is not affected from a CPU and memory perspective, are disclosed. In an embodiment, a conference server that is part of a communication network compliant with the Real Time Transport Protocol (RTP) is able to avoid regenerating FEC packets by not performing any FEC coding operation on the packets unless it is flagged to indicate regeneration via an FEC (e.g., Reed-Solomon) coding is necessary. Absent the flag, the conference server updates the received FEC packet as per the RTP and transmits the packet to its ultimate destination. Such disclosed systems, methods and computer program products are independent of the nature of the media being protected and flexible enough to support a wide variety of FEC techniques.

20 Claims, 7 Drawing Sheets

(56) References Cited

U.S. PATENT DOCUMENTS

| | | |
|---|---|---|
| 2002/0019967 A1 | 2/2002 | Bonifas |
| 2006/0013210 A1 | 1/2006 | Bordogna et al. |
| 2008/0225735 A1 | 9/2008 | Qiu et al. |
| 2009/0213726 A1* | 8/2009 | Asati et al. ............ 370/216 |
| 2009/0276686 A1* | 11/2009 | Liu et al. ............ 714/776 |
| 2010/0088569 A1 | 4/2010 | Sorbara et al. |

OTHER PUBLICATIONS

Qu, et al., "An Adaptive Motion-Based Unequal Error Protection Approach for Real-Time Video Transport Over Wireless IP Networks", IEEE Transactions on Multimedia, vol. 8, No. 5, Oct. 2006, 12 Pages.

Nick Feamster et al., "Packet Loss Recovery for Streaming Video," Published Date: Apr. 2002.

* cited by examiner

LOST REAL-TIME MEDIA PACKET RECOVERY

FIELD OF THE INVENTION

The present invention generally relates to the transmission of real-time media packets over computer networks and more particularly to systems, methods and computer program products for facilitating the recovery of lost packets within real-time applications executing within such networks.

BACKGROUND

In today's technological environment, it is common for individuals, business enterprises and other organizations to utilize computer-networked based, real-time communications such as peer-to-peer audio calls and video conferencing. Such real-time communications harness the power of the global, public Internet to allow greater communications and collaboration over long distances, increase productivity and save on travel cost. The real time communications involve information in various forms (e.g., voice, data, graphics, text, and digital) conveyed (i.e., transmitted and/or received) over a digital communication network (i.e., a computer communication network) wherein information is conveyed using packets. Many times these communication networks use the technique of packet switching where a transmitted packet may traverse several nodes within the communication network before it reaches its ultimate destination node.

A packet is a group of bits arranged and/or formatted in accordance with a particular protocol of a communication standard. Communication standards dictate how information is conveyed (i.e., transmitted and/or received) over digital communication networks (e.g., the Internet) and may use one or more protocols to define the arrangement, format, and interpretation of various portions of the packet. The various portions of a packet and their interpretation are defined by the protocol. A packet usually comprises a packet header and a packet payload. The packet header contains information describing particular characteristics of the information being conveyed in the packet. For example, the packet header may contain information that describes the type of information being conveyed (e.g., voice, video or graphics), the ultimate destination of the packet, the time at which the packet was transmitted, the particular source from which the packets was transmitted and other such information. The packet payload contains the actual information (e.g., voice, video or graphics) that is being transmitted.

For real-time communications (e.g., video or voice), delay in receiving communication packets, loss of packets, and/or receiving corrupted packets cannot be tolerated because of the nature of such communications. One technique that is used to address these undesirable phenomena is to retransmit the lost, delayed and/or corrupted packets of information. However this approach of retransmitting packets is costly as it requires additional bandwidth and often causes additional delays.

One particular protocol used for the conveyance of real-time information over a digital communication network such as the Internet is the Real time Transport Protocol (RTP) (e.g., Request For Comments 3550 or RFC 3550). The term RTP will hereinafter represent an overall protocol such as, for example, RFC 3550. In a communication network that is operated in accordance with the RTP, information is conveyed using RTP packets which are represented by a group of bits. RTP does not use the technique of retransmission, but uses Forward Error Correction (FEC) to detect errors in received packets and to recover lost packets. Forward Error Correction is a type of coding used in digital communication networks where, prior to transmission of the information, a certain coding operation (also called a protection operation) is performed on various portions of or the entire packet of information to generate redundant bits. Some well-known examples of this coding operation used in FEC include Exclusive-OR (XOR) operation, parity bit coding, Reed-Solomon (RS) coding and Hamming coding. The redundant bits are rearranged (i.e., formatted) in accordance with a protocol to form "protected" packets or packets carrying protected information. The information bits subjected to a coding operation prior to transmission are thus protected because any errors in such bits can be corrected and lost packets can be recovered at the ultimate destination nodes of the network using the same coding operation. The terms "coding operation" and "protection operation" will be used interchangeably within this disclosure to represent the FEC operation described above.

Packets, in real-time communications applications, are often called media packets. Certain information describing various aspects of the media payload is appended to the beginning of the media payload; this appended portion is called the media header. That is, the media header is a group of bits that describe, for example, the destination of the packet, the type of information that is contained in the media payload, the time at which the packet was transmitted, the source from which the packet was transmitted and other such types of information. The media header is appended to the media payload to form a media packet.

Coding of a media header and media payload using FEC results in the generation of redundant information that can be formed, in accordance with the RTP, into an FEC packet having header and payload portions. The FEC packet formed from the coding of the media packet thus contains protected information and is said to be associated with the media packet. The FEC packets are used to reconstruct (i.e., recover) lost media packets and/or to correct errors in media packets that are received but are corrupt. Both the media packets and the associated FEC packets are transmitted to their destination. At the destination, the receiving equipment, using the FEC packets, is able to detect the occurrence of lost media packets and/or corrupted media packets. For packets that are lost or corrupted, the receiving equipment, in a well-known fashion and in accordance with the RTP, performs the same protection operation performed at the transmit end and arranges the resulting bits (as per the RTP) to recover lost packets and/or correct corrupted packets.

In many current applications of real time communications where information is conveyed over computer networks, often a server is used to receive different packets carrying different types of information from a plurality of sources. The server may, for example, be part of a communication network infrastructure used in conducting video/voice conferencing between individuals located at various locations remote from each other. The server typically performs the same protection operation (as at the transmit end) on at least a portion of each received FEC packets in order to detect corrupted media packets and to recover lost media packets. The server then regenerates new FEC packets, which it then transmits along with the media packets to the ultimate destinations of these packets. As a result of processing many different packets from different sources for one conference, the processing that is done by the server becomes burdensome and particularly costly in terms of CPU time and memory usage. Moreover, the overall cost of managing the server and/or the communication network also increases.

Given the foregoing, what are needed are systems, methods and computer program products for facilitating the recovery of lost real-time media packets within real-time applications executing within a computer network implementing FEC such that server performance is not affected from a CPU and memory perspective.

SUMMARY

This summary is provided to introduce a selection of concepts. These concepts are further described below in the Detailed Description. This summary is not intended to identify key features or essential features of the claimed subject matter, nor is this summary intended as an aid in determining the scope of the claimed subject matter.

The present invention meets the above-identified needs by providing systems, methods and computer program products for facilitating the significant reduction of the amount of processing performed by an intermediate node (e.g., a conference server) within a packet switching and protocol compliant communication network, which uses FEC in conveying packets of information. In particular, a protection operation usually performed by the intermediate node on at least a portion of certain received packets containing protected information is eliminated. Further, the task of rearranging redundant information typically generated from such protection operation and the task of regenerating these packets from the rearrangement of redundant information are also eliminated. Despite the fact that at various defined times these certain packets are flagged to indicate to the intermediate node to perform the protection operation and the rearrangement of redundant information resulting from the protection operation, the overall amount of processing performed by the intermediate node on received packets is significantly reduced.

The systems, methods and computer program products of the present invention eliminate the processing of information by the intermediate node on at least a portion of each of the certain packets by first transmitting these packets with their at least portions unprotected; the systems, methods and computer program products of the present invention does this by first performing an anti-coding operation on at least a portion of each of these packets resulting in modified packets. The anti-coding operation is such that when it is performed on an identified portion of a packet resulting in a modified packet and is followed by a coding operation on the entire modified packet of information, the portion of the packets on which the anti-coding operation was done is left unprotected.

When the intermediate node receives these partially unprotected packets, it processes the unprotected portion (e.g., updates the unprotected portion) as per the communication protocol and then transmits them to their ultimate destination. In this manner, the intermediate node no longer performs the protection operation and it follows that the intermediate node also does not perform the rearrangement of redundant information resulting from the protection operation. As a result, there is no regeneration of these packets, which would have consumed much CPU (Central Processing Unit) time, memory and other resources of the intermediate node.

In one embodiment of the systems, methods and computer program products of the present invention, the intermediate node is a conference server that is part of a communication network compliant with the RTP, including a portion of the RTP dealing with carrying FEC payloads; this portion of the RTP is referred to as RFC (Request For Comments) 5109, which is incorporated herein by reference. In accordance with the RFC 5109 protocol, media packets and their associated FEC packets are formatted where various fields of their headers and payloads are defined for specific functions. The fields are specifically identified portions of a packet. The FEC packets contain protected information, part of which is updated by the conference server upon reception; the updating of these fields by the conference server is part of the requirements of the RFC 5109 protocol. The part of the FEC packet that is updated by the conference server comprises two fields called the CC (Contributing source Count) field and the TS (Time Stamp) field. Upon reception of an FEC packet, the conference server would perform a coding operation (e.g., Reed-Solomon coding) on the CC field and the TS field of the FEC packet. The resulting redundant information is used to rearrange the CC and TS fields (as per the RFC 5109 protocol) of the FEC packet thus regenerating a new FEC packet. The task of regenerating FEC packets by the conference server as per the RFC 5109 protocol is a burdensome and costly process for the Conference Sever and thus in many cases has an adverse effect on the performance of the conference server during use by many participants.

However, in the systems, methods and computer program products of the present invention, the FEC packets are transmitted with the portions that are to be updated by the conference server (i.e., the CC and TS bits) left unprotected. For the FEC packets that are to be transmitted with their CC and TS fields left unprotected, the systems, methods and computer program products of the present invention generate each such FEC packet as follows.

First, a duplicate media packet is generated from a media packet formatted as per the RFC 5109 protocol and which is ready for transmission. It is this duplicate media packet that will be transformed into an associated FEC packet having unprotected CC and TS fields. Then, an anti-coding operation on the CC and TS fields of the duplicate media packet is performed resulting in a modified media packet. A coding operation (e.g., Reed-Solomon coding) is then performed on the entire modified media packet. The resulting bits of information are then rearranged as per the RFC 5109 protocol to generate an associated FEC packet with the CC and TS field left unprotected.

The anti-coding operation is such that when it is performed on a portion of a packet of information (e.g., group of bits) resulting in a modified packet and the coding operation is performed on the entire packet of information and rearranged as per the protocol being followed, the portion of the packet on which the anti-coding operation was performed becomes unprotected. For this particular embodiment, if the coding operation is Reed-Solomon coding, an anti-coding operation is to set the CC field and the TS field to zero (i.e., all of the bits of these two fields are set to zero).

In alternate embodiments, the systems, methods and computer program products of the present invention may flag certain FEC packets that contain crucial information for various signals (e.g., voice, video or text) or portions of signals where it has been decided that such information is to be afforded as much protection as possible. These flagged FEC packets are transmitted fully protected and upon reception by the conference server they are processed as per RFC 5109. That is, the protection operation is performed on the entire FEC packet (including the updated TS and CC fields), and a new FEC packet is regenerated and then transmitted to its ultimate destination by the conference server. In such an embodiment, a bit referred to as the "C" bit (which is part of the FEC payload) is used as a flag to indicate whether the CC and TS bits are being protected. If C=1, this indicates that CC and TS fields are being protected, and when the C bit is set to 0, this indicates that the TS and CC fields for that packet have been left unprotected. Thus, depending on the value of the C bit, the conference server will process the received FEC packet accordingly.

Upon reception of a partially unprotected FEC packet, the conference server updates the CC and TS fields and transmits the updated FEC packet to its destination without having to perform a coding operation on the CC and TS fields, and also without having to rearrange the resulting redundant bits to form a new FEC packet. At the destination, during recovery of the media packet, the CC and TS bits of the FEC packet are copied into received media packets as FEC packets and media packets have the same CC and TS values at this point. By leveraging the TS and CC values of the FEC packets, the media packets' TS and CC values can be recovered without having to regenerate the FEC packets at the conference server. In this manner, the conference server no longer has to perform the burdensome coding and regeneration of FEC packets, thus significantly reducing its processing of FEC packets and the usage of CPU time and memory space resources.

Further features and advantages of the present invention, as well as the structure and operation of various embodiments of the present invention, are described in detail below with reference to the accompanying drawings.

DESCRIPTION OF THE DRAWINGS

The features and advantages of the present invention will become more apparent from the detailed description set forth below when taken in conjunction with the drawings in which like reference numbers indicate identical or functionally similar elements.

DETAILED DESCRIPTION

The present invention meets the above-identified needs by providing systems, methods and computer program products for facilitating the significant reduction of the amount of processing performed by an intermediate node (e.g., a conference server) within a packet switching and protocol compliant communication network, which uses FEC in conveying packets of information. More specifically, a protection operation usually performed by the intermediate node on at least a portion of certain received packets containing protected information is eliminated. Further, the task of rearranging redundant information typically generated from such protection operation and the task of regenerating these packets from the rearrangement of redundant information are also eliminated. Despite the fact that at various defined times these certain packets are flagged to indicate to the intermediate node to perform the protection operation, and the rearrangement of redundant information resulting from the protection operation, the overall amount of processing performed by the intermediate node on received packets is significantly reduced. Thus, upon reception of a received packet containing protected information, the intermediate node confirms whether such a protected packet has been flagged to determine its course of action. No protection operation is performed on a received packet when its flag indicates a portion of the packet is unprotected.

The systems, methods and computer program products of the present invention eliminate the processing of information by the intermediate node on at least a portion of each of the certain packets by first transmitting these packets with their at least portions unprotected. This is accomplished by first performing an anti-coding operation on at least a portion of each of these packets resulting in modified packets. The anti-coding operation is such that when it is performed on an identified portion of a packet resulting in a modified packet and is followed by a coding operation on the entire modified packet of information, the portion of the packets on which the anti-coding operation was done is left unprotected. That is, there may be redundant information generated from the coding operation on the modified packet, but whatever additional information that is generated from the coding operation on the modified packet cannot be used to properly recover or correct errors in the packet of information after having traversed one or more nodes of the communication network.

When the intermediate node receives these partially unprotected packets, it processes the unprotected portion (e.g., updates the unprotected portion) as per the communication protocol in use by the network, and then transmits them to their ultimate destination. In this manner, the intermediate node no longer performs the protection operation and it follows that the intermediate node also does not perform the rearrangement of redundant information resulting from the protection operation. As a result, there is no regeneration of these packets, which normally consumes CPU (Central Processing Unit) time, memory and other resources of the intermediate node.

In one embodiment, the intermediate node is a conference server that is part of a communication network compliant with the RTP including a portion of the RTP dealing with carrying FEC payloads; this portion of the RTP is referred to as RFC 5109. In accordance with the RFC 5109 protocol, media packets and their associated FEC packets are formatted where various fields of their headers and payloads are defined for specific functions. The fields are specifically identified portions of a packet. The FEC packets contain protected information, part of which is updated by the conference server upon reception. The updating of these fields by the conference server is part of the requirements of the RFC 5109 protocol. The part of the FEC packet that is updated by the conference server comprises two fields called the CC (Contributing source Count) field and the TS (Time Stamp) field.

Upon reception of an FEC packet, the conference server would perform a coding operation (e.g., Reed-Solomon coding) on the CC field and the TS field of the FEC packet. The resulting redundant information is used to rearrange the CC and TS fields (as per the RFC 5109 protocol) of the FEC packet, thus regenerating a new FEC packet. The task of regenerating FEC packets by the conference server as per the RFC 5109 protocol is a burdensome and costly process for the Conference Sever and thus in many cases has an adverse effect on the performance of the conference server during conferences having many participants.

By contrast, in the present invention, FEC packets are transmitted with the portions that are to be updated by the conference server (i.e., the CC and TS bits) left unprotected. For the FEC packets that are to be transmitted with their CC and TS fields left unprotected, the systems, methods and computer program products of the present invention generate each such FEC packet as described below.

Figure 1:
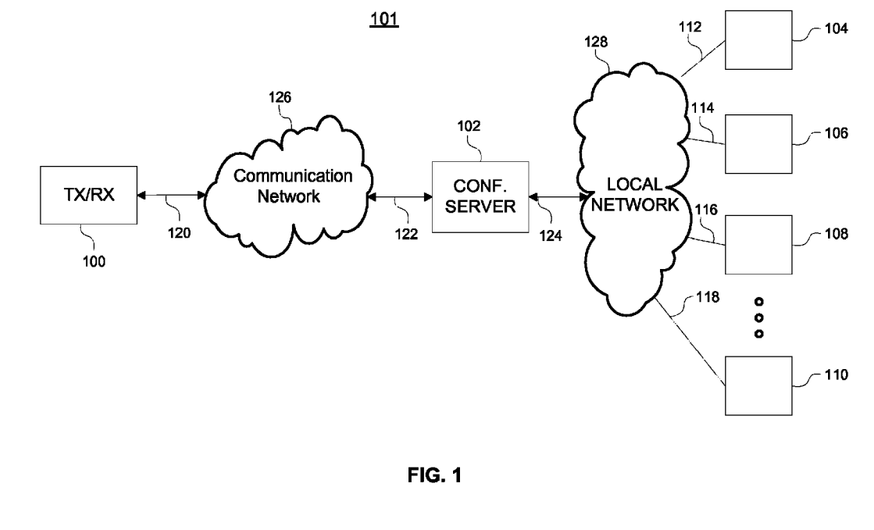
FIG. 1 is a block diagram illustrating an exemplary network environment (including a conference server, a transmit source and various receiving nodes) operating according to an embodiment of the present invention.

Referring to FIG. 1, a block diagram illustrating an exemplary network environment 101 operating according to an embodiment of the present invention is shown. Environment 101 complies with the RFC 5109 protocol and includes a communication node 100, which has transmission and reception equipment, conveys (i.e., transmits and/or receives) information in the form of packets to the communication network 126 over communication link 120. Communication network 126 and communication link 120 represent various communication equipment that together operate to generate, process, transmit, and receive packets of information in accordance with a communication standard that uses the RTP including the RFC 5109 protocol. Communication environment 101 also includes conference server 102, which receives and transmits information between: various nodes 104, 106, 108 and 110 via communication links 112, 114, 116 and 118, respectively; and local network 128 and communication links 122 and 124. It will be readily understood that the various communication links and networks may convey information with various types of signals such as analog, digital, electrical, optical and/or electromagnetic signals. Node 100, conference server 102 and nodes 104, 106, 108 and 110 represent communication equipment that can transmit, receive and process packets of information as per the RFC 5109 protocol (as modified per the systems, methods and computer program products of the present invention).

For ease of explanation of the present invention, environment 101 will be discussed for the particular circumstance where media packets are being transmitted from communication node 100 to conference server 102, which relays the packets to one or more of nodes 104, 106, 108 and 110. The packets comprise media packets and FEC packets both of which are formatted as per the RFC 5109 protocol.

Figure 2:
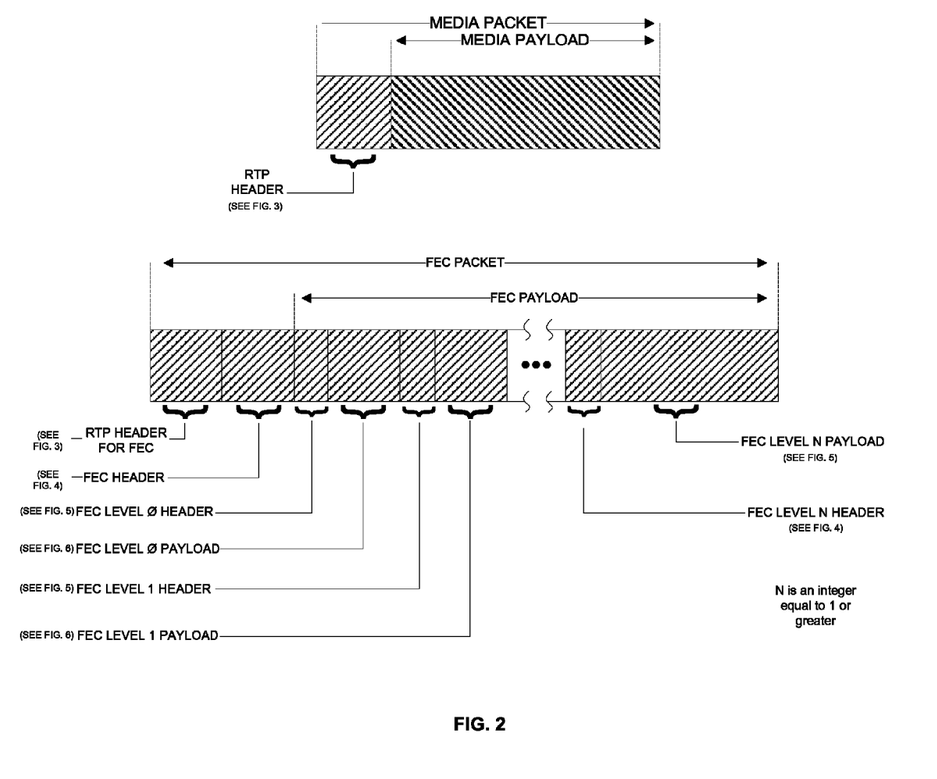
FIG. 2 is a block diagram illustrating the format of an RTP packet.

Referring to FIG. 2, there is shown the particular format for a media packet and an FEC packet in accordance with the RTP, including RFC 5109. The media and FEC packets each have a header portion and a payload portion.

Figure 3:
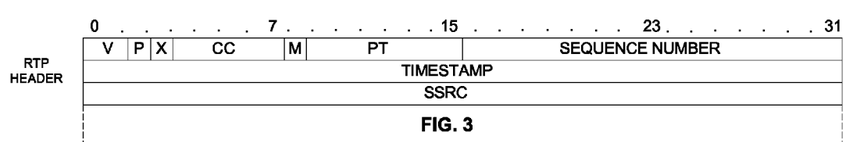
FIG. 3 is a block diagram illustrating the particular format of the RTP header.

Referring to FIG. 3, the particular format of the RTP header is shown. In particular, the RTP header comprises at least 96 bits. The first two bits are designated as the V bits field indicating the particular version of the RTP header. The third bit is designated as the P bit (or Padding bit) indicating whether additional padding octets (grouping of eight bits) are appended to the Media packet. The next field is four bits in length (bits 4-7) designated as the CC bits (Contributing Source Count).

The next field is the X bit (i.e., bit 4) called the Extension bit indicating whether a fixed header is followed by one header extension. The Contributing Source is a source of a stream of RTP packets that have contributed to the combined stream produced by an RTP mixer. The mixer inserts a list of the SSRC (Synchronization Source) identifiers of the sources that contributed to the generation of a particular packet into the RTP header of that packet. This list is called the CSRC list. An example application is audio conferencing where a mixer indicates all of the talkers whose speech was combined to produce the outgoing packet, allowing the receiver to indicate the current talker, even though all the audio packets contain the same SSRC identifier (defined below). The CSRC count contains the number of identifiers that follow the fixed header.

The next field (i.e., bit 8) is called the M bit (or Marker bit) indicating whether significant events to be marked in the packet stream. RFC 5109 does not use this field and thus M will be set to zero in an embodiment.

The next field (bits 9-15) of the RTP header is called the PT field (Payload Type), which identifies the format of the RTP payload and determines its interpretation by the application. The next field (bits 16-31) is the Sequence Number (SN) field, which increments by one for each RTP data packet sent, and may be used by the receiver to detect packet loss and to restore packet sequence. The initial value of the sequence number is random (unpredictable). The sequence number increments by one for each RTP data packet sent, and may be used by the receiver to detect packet loss and to restore packet sequence.

The next field of the RTP header is the SSRC field (Synchronization Source) (bits 64-95), which identifies the synchronization source with the intent that no two synchronization sources within the same RTP session will have the same SSRC. Although the probability of multiple sources choosing the same identifier is low, RTP implementations are to be prepared to detect and resolve collisions. If a source changes its source transport address, it also chooses a new SSRC to avoid being interpreted as a looped source. The SSRC value shall be the same as the SSRC value of the media stream it protects.

Figure 4:
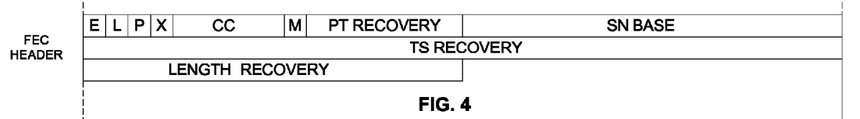
FIG. 4 is a block diagram illustrating the format for an FEC header.

Referring now to FIG. 4, there is shown the format for the FEC header. The FEC header is 10 octets in length. The format of the header include an extension flag (E bit), long-mask flag (L bit), P recovery field, X recovery field, CC recovery field, M recovery field, PT recovery field, SN base field, TS recovery field, and length recovery field. The E bit is the extension flag reserved to indicate any future extension to the present specification. It shall be set to 0, and should be ignored by the receiver. The L bit indicates whether the long mask is used. When the L bit is not set, the mask is 16 bits long. When the L bit is set, the mask is then 48 bits long.

The P recovery field, the X recovery field, the CC recovery field, the M recovery field, and the PT recovery field are obtained via the protection operation applied to the corresponding P, X, CC, M, and PT values from the RTP header of the media packets associated with the FEC packet.

The SN base field is to be set to the lowest sequence number, taking wrap around into account, of those media packets protected by FEC (at all levels). This allows for the FEC operation to extend over any string of at most 16 packets when the L field is set to 0, or 48 packets when the L field is set to one, and so on.

The TS recovery field is computed via the protection operation applied to the timestamps of the media packets associated with this FEC packet. This allows the timestamp to be completely recovered. The length recovery field is used to determine the length of any recovered packets. It is computed via the protection operation applied to the unsigned network-ordered 16-bit representation of the sums of the lengths (in bytes) of the media payload, CSRC list, extension and padding of each of the media packets associated with this FEC packet. (In other words, the CSRC list, RTP extension, and padding of the media payload packets, if present, are "counted" as part of the payload.) This allows the FEC procedure to be applied even when the lengths of the protected media packets are not identical. For example, assume that an FEC packet is being generated by XOR'ing two media packets together. The length of the payload of two media packets is 3 (0b011) and 5 (0b101) bytes, respectively. The length recovery field is then encoded as 0b011 XOR 0b101=0b110.

Figure 5:
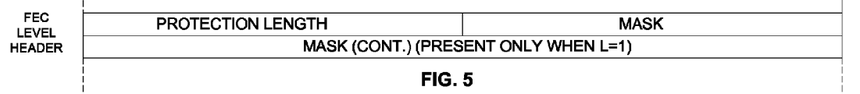
FIG. 5 is a block diagram illustrating the format of an FEC level header.

Referring now to FIG. 5, there is shown the format of the FEC level header. The FEC level header is 4 or 8 octets—depending on the L bit in the FEC header. The FEC level headers consist of a protection length field and a mask field. The protection length field is 16 bits long. The mask field is 16 bits long (when the L bit is not set) or 48 bits long (when the L bit is set). The mask field in the FEC level header indicates which packets are associated with the FEC packet at the current level. It is either 16 or 48 bits depending on the value of the L bit. If bit i in the mask is set to one, then the media packet with sequence number N+i is associated with this FEC packet, where N is the SN Base field in the FEC packet header. The most significant bit of the mask corresponds to i=0, and the least significant to i=15 when the L bit is set to zero, or i=47 when the L bit is set to one. The protection length has the longest length of all media packets that need to be protected. For example, if 5 media packets need to be protected and their lengths are respectively 15, 20, 24, 30 and 36 bits, the protected length is 36. If any of the protected bit strings from the media packets are shorter than the protection length, they are padded to that length. The padding using an octet 0 should be added at the end of the bit string.

Figure 6:
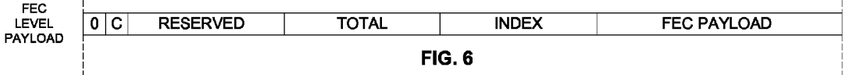
FIG. 6 is a block diagram illustrating the format for an FEC level payload when its extension bit is set to zero according to an embodiment of the present invention.
Figure 7:
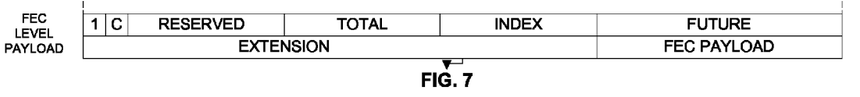
FIG. 7 is a block diagram illustrating the format for an FEC level payload when its extension bit is set to one according to an embodiment of the present invention.

Referring to FIG. 6 and FIG. 7, block diagrams illustrating the format for an FEC level payload when its extension bit is set to zero or one, respectively, according to an embodiment of the present invention, are shown. The format of the FEC level payload when the second bit (or C bit) is set to zero is shown in FIG. 6, which means the CSRC, CC and Timestamp are not protected through FEC coding. When the C bit is set to one, as shown in FIG. 7, the CSRC, CC and Timestamp are protected through the use of FEC coding. For FEC recovery at a receive side of a node of the communication network, the receiver will check the value of the C bit to determine whether the node that transmitted the RTP packet has provided protection for CSRC, CC and timestamp fields of the RTP packet. The Total field is 6 bits long and it indicates the total number of FEC packets that belong to the current FEC packet. The first bit of the FEC level payload is the Extension bit and when it is set to one, the FEC payload is as shown in FIG. 7. Note that the Extension bit is set to zero for the FEC level payload of FIG. 6, which does not have Future Extension portions as shown in FIG. 7.

Referring again to FIG. 1, in an embodiment, communication node 100 is transmitting media packets and associated FEC packets in accordance with RFC 5109 as modified by the systems, methods and computer program products of the present invention to conference server 102 via communication link 120, communication network 126 and communication link 122. Conference server 102 receives the packets, updates the FEC packets as per the present invention and transmits the updated FEC packets and associated media packets to communication node 108 via communication link 124, local communication network 128 and communication link 116. It will be readily understood by those skilled in the relevant art(s), that communication node 108 as well as the other communication nodes all possess transmit and receive equipment capable of practicing the present invention. However, for clarity of explanation, we focus on communication node 108 and its operation as a receiver of information packets transmitted by communication node 100. It will be further understood that the information transmitted by communication node 100 traverses various communication nodes within communication network 126 and each such nodes may practice the present invention in the same manner as conference server 102.

Figure 8:
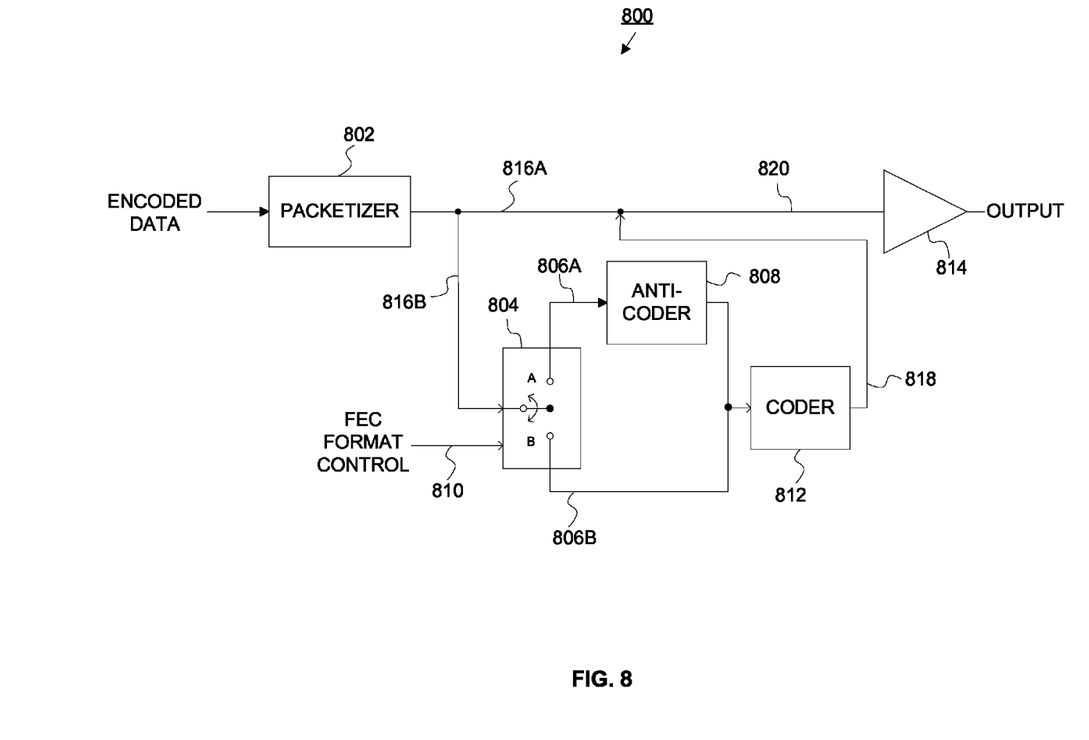
FIG. 8 is a block diagram illustrating a transmitter device within a communication network designed to transmit packets of information according to an embodiment of the present invention.

Referring now to FIG. 8, a block diagram illustrating a transmitter device 800 within communication node 100 designed to transmit packets of information, according to an embodiment of the present invention, is shown. The architecture of transmission equipment 800 is shown as various modules coupled in a particular arrangement for generating FEC packets with unprotected CC and TS fields and FEC packets with protected bits where the status of the FEC packet is indicated by the C bit in the FEC payload. As explained earlier, the C bit is set to zero when the CC and TS fields are left unprotected and the C bit is set to one when the entire FEC packet including the CC and TS fields are protected. Raw data (e.g., voice, video, text etc.) is encoded by a codec (not shown) resulting in encoded data. The encoded data is inputted to packetizer module 802, which formats the encoded data into a media packet as per the RTP (e.g., RFC 3550) including RFC 5109 and related RFCs such as, for example, RFC 3551.

Packetizer module 802 generates a media packet as per the RTP including the RFC 5109 protocol and outputs the packet onto paths 816A and 816B. Path 816A couples the output of packetizer module 802 to path 820 one end of which is coupled transmitter 814. Transmitter 814 then transmits the media packet. Path 816B is coupled to FEC Format Control module 804, which has two outputs one of which is coupled to anti-coder module 808 via path 806A and the other of which is coupled to Protection Indicator module 810 via path 806B. The outputs of modules 808 and 810 are coupled to coder module 812 whose output is coupled to path 820 via path 818. Path 820 thus has both FEC packets and media packets, which are transmitted by transmitter 814. Transmitter 814 contains the proper equipment to transform the packets into the appropriate signals for the communication link (e.g., link 120) onto which the packets are transmitted. Depending on the state of FEC format control module 804, the FEC packet being transmitted may have its CC and TS fields unprotected. The generation of the FEC packets will now be discussed.

Still referring to FIG. 8, the media packet generated by packetizer module 802 and appearing on path 816B is inputted into format control module 804. A control signal appears at a control input of module 804 via path 810 and either sets an internal switch within module 804 to output the media packet on either path 806A or 806B. That is, format control module 804 is selectively coupled to coder 812 and anti-coder 808. If the transmit node wishes to transmit the FEC packet with unprotected CC and TS fields, module 804 is controlled to apply the media packet onto path 806A where Anti-Coder module 808 performs an anti-coding operation. For the particular implementation of the RTP (such as, for example, RFC 3550) that includes RFC 5109 where the coding operation is Reed-Solomon coding, the anti-coding operation sets the CC and TS fields to zero bits. Depending on the coding operation and the portion of the packets that needs to remain unprotected, an appropriate anti-coding operation is performed for the particular implementation. The output of anti-coder 808 is applied to coder module 812, which performs the Reed-Solomon coding operation. Applying the Reed-Solomon coder to the packet from anti-coder 808 and rearranging the resulting redundant bits to in accordance with the RFC 5109 format yields an FEC packet with the CC and TS fields left unprotected. Also, the C bit of the FEC payload is set to one after the rearrangement of the redundant bits. The resulting FEC packet with unprotected CC and TS fields thus appears on path 818, onto path 820 and is then transmitted by transmitter 814.

When it is desired to transmit the FEC packet fully protected, the control signal on path 810 controls module 804 to output the packet onto path 806B applying the packet to coder 812 bypassing anti-coder 808 and the resulting redundant bits from the coding operation (e.g., Reed-Solomon coding) are rearranged as per the RFC 5109 protocol. Further, the C bit of the FEC payload is set to one. In this case, the output of the coder is a fully protected FEC packet, which is then transmitted by transmitter 814. Thus, the format control module 804 has two modes of operation: one mode causes module 804 to bypass the anti-Coder 808 and apply the formed packet directly to the Coder 812; and the other mode causes module 804 to apply the formed packet to anti-coder 808 whose output is then applied to Coder 812.

The various modules shown in FIG. 8 can be implemented with digital logic and combinatorial circuits. The modules can also be implemented with a microprocessor-based circuit using firmware to realize the various operations. The modules can also be implemented using a microcomputer, microcontroller, laptop computer, a desktop computer or any device in which digital information can be processed and rearranged to perform the various operations required to perform packetizing, anti-coding, coding and transmission of digital packets of information. Those who are skilled in the relevant art(s), after reading the description herein, will be readily capable to design circuits, computer based or microprocessor based systems and/or a combination thereof to implement transmission device of the present invention.

Figure 9:
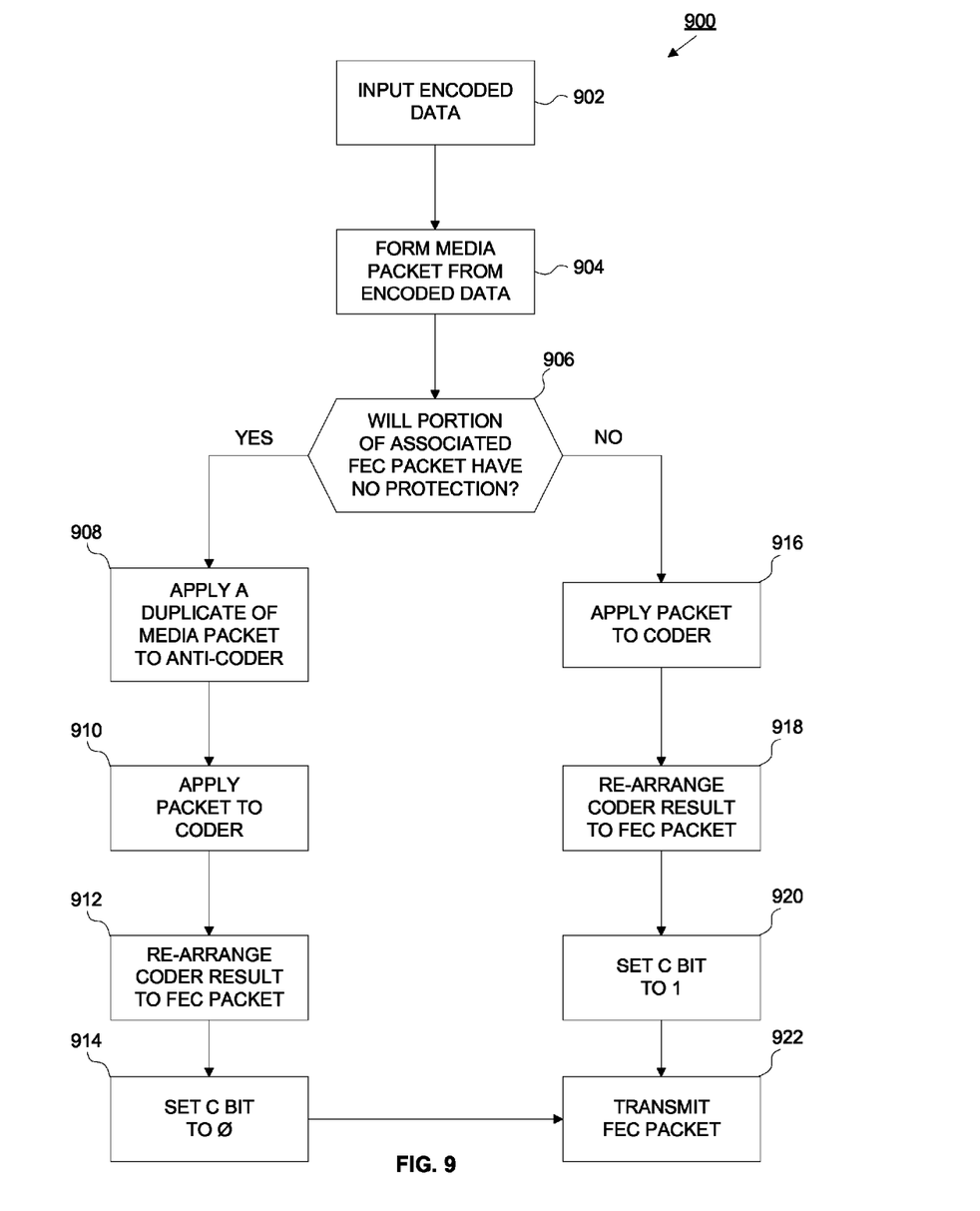
FIG. 9 is a flow chart illustrating a method for node of a communication network transmitting packets of information according to an embodiment of the present invention.

Referring now to FIG. 9, a flow chart illustrating an FEC packet transmission method 900 (either fully protected or with a portion of the packets left unprotected), according to an embodiment of the present invention, is shown. In step 902, raw data is inputted into the transmission equipment. In step 904, the raw data is encoded (not shown) and then packetized into a packet in accordance with a protocol being followed by the communication network within which the transmission system is operating. In the particular embodiment being discussed, the raw data is formatted into a media packet in accordance with the RTP, such as for example, RFC 3550. In step 906, method 900 determines whether to generate the associated FEC packet with the CC fields and the TS fields left unprotected. If the associated FEC packet is to have unprotected CC and TS fields, method 900 proceeds to step 908 where a duplicate of the media packet is applied to an anti-coder, which performs an anti-coding operation on the CC and TS fields of the duplicate media packet. In this embodiment, the anti-coding operation is the setting of the CC field and the TS field to zero resulting in a modified media packet. The modified media packet is then fed to a coder that performs Reed-Solomon coding in step 910. The resulting redundant information from the coding operation is then rearranged as per the RFC 5109 format in step 912, resulting in an FEC packet where the CC and TS fields are not protected. In step 914, the C bit of the FEC packet is set to zero and in step 922 the FEC packet is transmitted.

Returning to step 906, if the packet is to have no portion left unprotected, the method of the present invention moves to step 916 where the duplicate media packet is inputted into a coder where a coding operation such as Reed-Solomon coding is performed on the duplicate media packet. In step 918, the resultant information bits from the coding operation are arranged as per the defined format of the RFC 5109 protocol to form an associated FEC packet. In step 920, the C bit of the FEC packet is set to one to indicate that the entire FEC packet is protected. In step 922 the FEC packet is transmitted.

Figure 10:
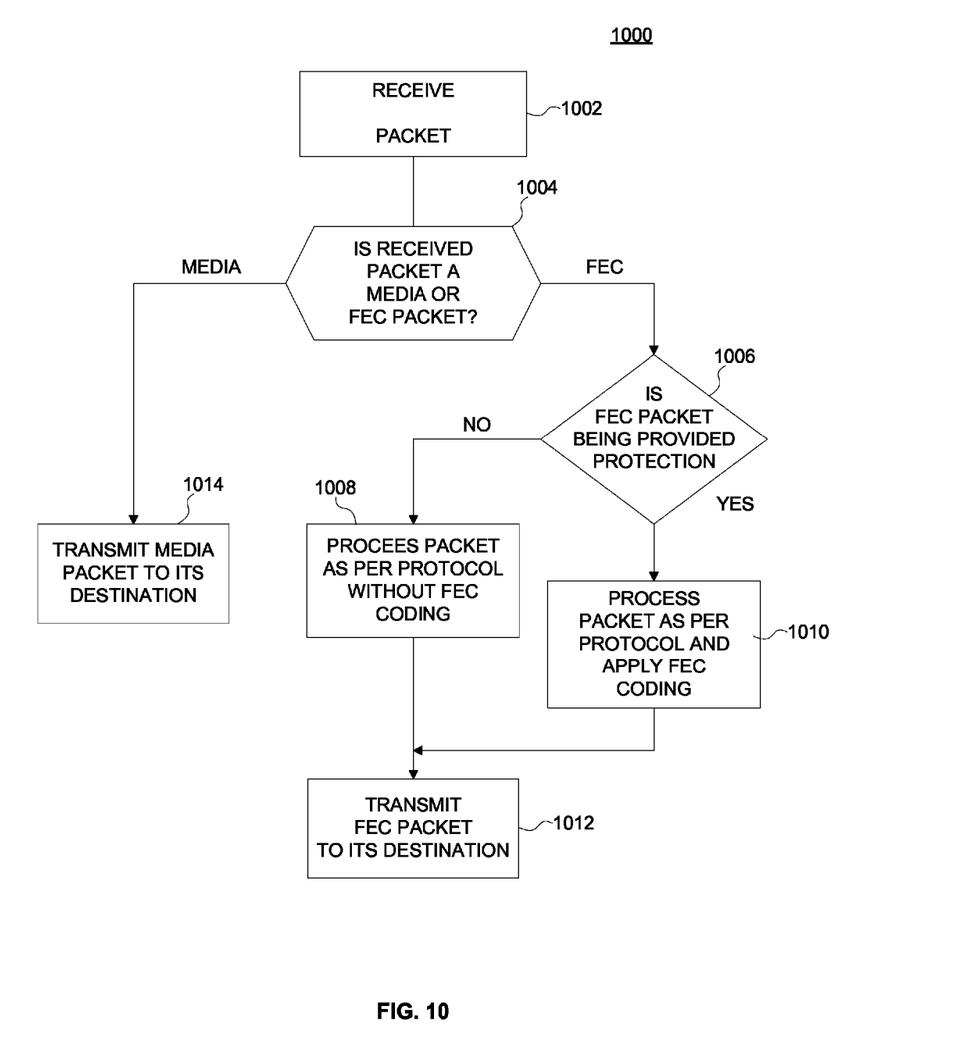
FIG. 10 is a flow chart illustrating a method for a node of a communication network receiving packets of information according to an embodiment of the present invention.

Referring to FIG. 10, a flow chart illustrating an FEC packet receiving method, according to an embodiment of the present invention, is shown. In step 1002, a packet is received by the conference server. In step 1004, the conference server determines whether the received packet is a media packet or an FEC packet. If the received packet is a media packet, method 1000 proceeds to step 1014 where the conference server updates the CC and TS fields of the packet and transmits the packet to its ultimate destination. However, if the received packet is an FEC packet, method 1000 proceeds to step 1016 where it is determined if the received packet contains protected information in all its fields. The conference server determines the status of the received packet by checking the value of the C bit of the FEC packet. If the C bit is zero, then method 1000 proceeds to step 1008 where the CC and TS fields of the packet are updated and then transmitted to its ultimate destination without performing any coding, rearrangement of bit and regeneration of a new FEC packet. However, if the C bit is one, method 1000 proceeds to step 1008 where the conference server processes the received packet as per RFC 5109 by first updating the CC and TS fields, applying the updated packet to a coder (e.g., Reed-Solomon coding), rearranging the redundant bits for CC and TS and generating a new FEC packet. In step 1012, the conference server transmits the regenerated FEC packet to its ultimate destination.

In alternate embodiments, method 1000 may be implemented with microprocessor based computer systems and/or processor based circuitry operating under the control of one or more processors programmed with firmware to receive packets of information, and process such packets as described above.

Figure 11:
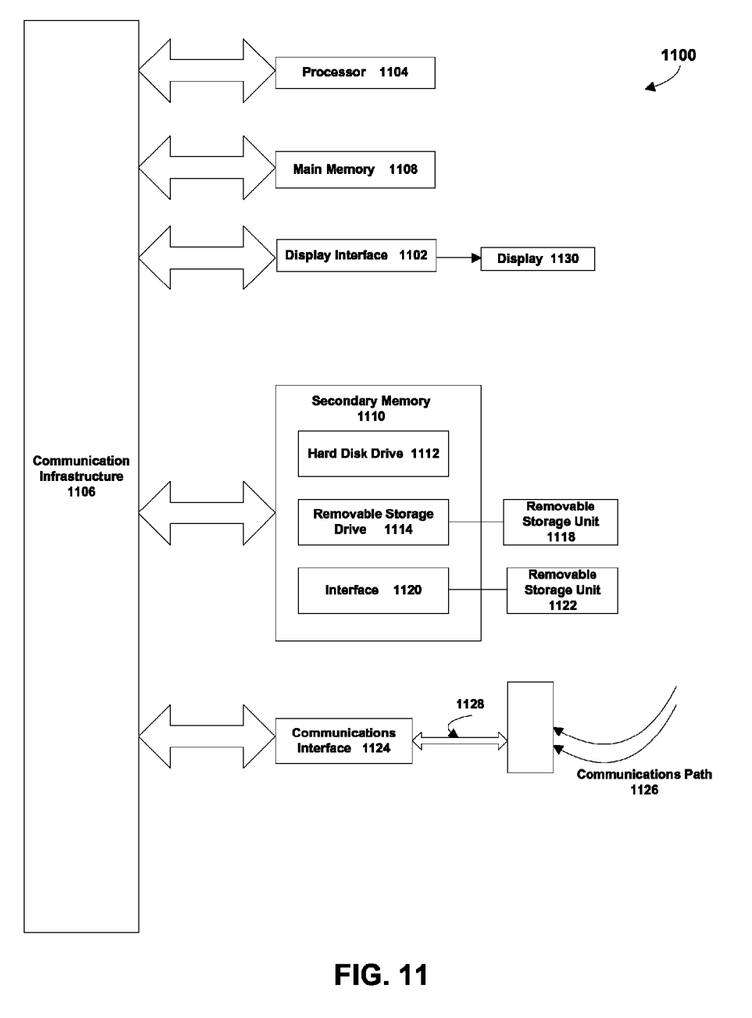
FIG. 11 is a block diagram of an exemplary computer system useful for implementing the present invention.

In one embodiment, the present invention (or any components thereof) is directed toward one or more computer systems capable of carrying out the functionality described herein. An example of a computer system 1100 is shown in FIG. 11.

Computer system 800 includes one or more processors, such as processor 1104. The processor 1104 is connected to a communication infrastructure 1106 (e.g., a communications bus or network). Various software aspects are described in terms of this exemplary computer system. After reading this description, it will become apparent to a person skilled in the relevant art(s) how to implement the invention using other computer systems and/or architectures.

Computer system 1100 can include a display interface 1102 that forwards graphics, text and other data from the communication infrastructure 1106 (or from a frame buffer not shown) for display on the display unit 1130.

Computer system 1100 also includes a main memory 1108, preferably random access memory (RAM) and may also include a secondary memory 1110. The secondary memory 1110 may include, for example, a hard disk drive 1112 and/or a removable storage drive 1114, representing a floppy disk drive, a magnetic tape drive, an optical disk drive, etc. The removable storage drive 1114 reads from and/or writes to a removable storage unit 1118 in a well known manner. Removable storage unit 1118 represents a floppy disk, magnetic tape, optical disk, etc. which is read by and written to by removable storage drive 1114. As will be appreciated, the removable storage unit 1118 includes a computer usable storage medium having stored therein computer software and/or data.

In alternative aspects, secondary memory 1110 may include other similar devices for allowing computer programs or other code or instructions to be loaded into computer system 1100. Such devices may include, for example, a removable storage unit 1122 and an interface 1120. Examples of such may include a program cartridge and cartridge interface (such as that found in video game devices), a removable memory chip (such as an erasable programmable read only memory (EPROM), or programmable read only memory (PROM)) and associated socket and other removable storage units 1122 and interfaces 1120, which allow software and data to be transferred from the removable storage unit 1122 to computer system 1100.

Computer system 1100 may also include a communications interface 1124. Communications interface 1124 allows software and data to be transferred between computer system 1100 and external devices. Examples of communications interface 1124 may include a modem, a network interface (such as an Ethernet card), a communications port, a Personal Computer Memory Card International Association (PCM-CIA) slot and card, etc. Software and data transferred via communications interface 1124 are in the form of non-transitory signals 1128 which may be electronic, electromagnetic, optical or other signals capable of being received by communications interface 1124. These signals 1128 are provided to communications interface 1124 via a communications path (e.g., channel) 1126. This channel 1126 carries signals 1128 and may be implemented using wire or cable, fiber optics, a telephone line, a cellular link, an radio frequency (RF) link and other communications channels.

In this document, the terms "computer program medium" and "computer usable medium" are used to generally refer to media such as removable storage drive 1114, a hard disk installed in hard disk drive 1112 and signals 1128. These computer program products provide software to computer system 1100. The invention is directed to such computer program products.

Computer programs (also referred to as computer control logic) are stored in main memory 1108 and/or secondary memory 1110. Computer programs may also be received via communications interface 1124. Such computer programs, when executed, enable the computer system 1100 to perform the features of the present invention, as discussed herein. In particular, the computer programs, when executed, enable the processor 1104 to perform the features of the present invention. Accordingly, such computer programs represent controllers of the computer system 1100.

In an embodiment where the invention is implemented using software, the software may be stored in a computer program product and loaded into computer system 1100 using removable storage drive 1114, hard drive 1112 or communications interface 1124. The control logic (software), when executed by the processor 1104, causes the processor 1104 to perform the functions of the invention as described herein.

In another embodiment, the invention is implemented primarily in hardware using, for example, hardware components such as application specific integrated circuits (ASICs). Implementation of the hardware state machine so as to perform the functions described herein will be apparent to persons skilled in the relevant art(s).

As will be apparent to one skilled in the relevant art(s) after reading the description herein, the computer architecture shown in FIG. 11 may be configured as a desktop, a laptop, a server, a tablet computer, a PDA, a mobile computer, an intelligent communications device or the like.

In yet another embodiment, the invention is implemented using a combination of both hardware and software.

The systems, methods and computer program products for facilitating the recovery of lost real-time media packets disclosed herein are: independent of the nature of the media being protected (e.g., video, audio, etc.); flexible enough to support a wide variety of FEC configurations/techniques; and adaptive enough so that the FEC technique can be modified easily without any out-of-band signaling systems. Thus, while various aspects of the present invention have been described above, it should be understood that they have been presented by way of example and not limitation. It will be apparent to persons skilled in the relevant art(s) that various changes in form and detail can be made therein without departing from the spirit and scope of the present invention. Therefore, the present invention should not be limited by any of the above described exemplary aspects, but should be defined only in accordance with the following claims and their equivalents.

In addition, it should be understood that the figures in the attachments, which highlight the structure, methodology, functionality and advantages of the present invention, are presented for example purposes only. The present invention is sufficiently flexible and configurable, such that it may be implemented in ways other than that shown in the accompanying figures.

Further, the purpose of the foregoing Abstract is to enable the U.S. Patent and Trademark Office and the public generally and especially the scientists, engineers and practitioners in the relevant art(s) who are not familiar with patent or legal terms or phraseology, to determine quickly from a cursory inspection the nature and essence of this technical disclosure. The Abstract is not intended to be limiting as to the scope of the present invention in any way.

What is claimed is:

1. A method for processing packets by an intermediate node in a communication network, comprising:
    receiving a first packet containing media data and a second packet containing protected information related to the media data, the protected information containing redundant bits corresponding to at least a portion of the media data of the first packet, the redundant bits being configured to correct transmission errors in the media data of the first packet;
    determining whether the received second packet includes an unprotected portion that does not include redundant bits for correcting transmission errors in the unprotected portion of the second packet; and
    in response to determining that the received second packet includes the unprotected portion,
       retransmitting the first packet; and
       retransmitting the second packet without performing a protection operation on the second packet to regenerate the received second packet.

2. The method of claim 1, further comprising:
    in response to determining that the received second packet does not include the unprotected portion,
       performing the protection operation on the second packet to regenerate the received second packet; and
       transmitting the regenerated second packet via the communication network.

3. The method of claim 1, further comprising in response to determining that the received second packet includes the unprotected portion, updating the unprotected portion of the second packet in accordance with a protocol being utilized by the communication network.

4. The method of claim 1, wherein the received second packet is an forward error control ("FEC") packet, and wherein the unprotected portion of the second packet includes contributing source count ("CC") bits and time stamp ("TS") bits of the FEC packet.

5. The method of claim 4, wherein the intermediate node includes a conference server, and wherein the FEC packet is transmitted by the conference server in accordance with a communication protocol utilized by the communication network.

6. The method of claim 5, further comprising:
performing, by the conference server, a protection operation on the FEC packet.

7. The method of claim 5, further comprising:
setting, by the conference server, a bit of the FEC packet to indicate that the FEC packet includes the unprotected portion.

8. The method of claim 7, further comprising:
transmitting, by the conference server, the FEC packet to a target destination.

9. The method of claim 1, wherein the protection operation includes Reed-Solomon coding.

10. The method of claim 1, wherein determining whether the received second packet includes the unprotected portion includes determining whether the received second packet includes the unprotected portion based on an indication bit included in a preamble of the second packet.

11. A computer-implemented method of generating protected information related to a real-time media application for transmission over a communication network, comprising:
packetizing raw media information into a first packet containing media data;
performing an anti-coding operation on a portion of a copy of the first packet to generate a modified first packet with an anti-coding portion;
performing a Forward Error Control ("FEC") coding operation on the modified first packet with the anti-coding portion to generate a second packet, the second packet containing:
redundant bits configured to correct transmission errors in the media data of the first packet; and
an unprotected portion that does not include redundant bits configured to correct transmission errors in the unprotected portion of the second packet, the unprotected portion of the second packet corresponding to the anti-coding portion of the modified first packet; and
transmitting both the first and second packets to a target destination via the communication network.

12. The method of claim 11, wherein the second packet is flagged prior to transmission to indicate that the second packet includes the unprotected portion.

13. The method of claim 11, wherein the communication protocol is in accordance with request for comment ("RFC") 5109.

14. The method of claim 13, wherein the second packet is an FEC packet, and wherein the unprotected portion of the FEC packet comprises contributing source count ("CC") and time stamp ("TS") fields of the FEC packet.

15. The method of claim 14, wherein the anti-coding operation comprises setting the CC and TS fields to zero, and wherein the FEC coding operation is Reed-Solomon-coding.

16. A computing device, comprising:
a processor;
a communications interface operatively coupled to the processor; and
a memory operative coupled to the processor, the memory containing instructions that when executed by the processor, cause the processor to perform a process comprising:
generating a first packet containing media data;
performing an anti-coding operation on a portion of a copy of the first packet to generate a modified first packet with an anti-coding portion;
performing a coding operation on the modified first packet with the anti-coding portion to generate a second packet, the second packet containing:
redundant bits for correcting transmission errors in the media data of the first packet; and
an unprotected portion that does not include corresponding redundant bits for correcting transmission errors in the unprotected portion of the second packet, the unprotected portion of the second packet corresponding to the anti-coding portion of the modified first packet; and
transmitting both the first and second packets to a target destination over a communication network via the communications interface.

17. The computing device of claim 16 wherein the modified first packet includes a preamble, and wherein performing the anti-coding operation includes performing the anti-coding operation on a portion of the preamble of the modified first packet.

18. The computing device of claim 16 wherein the modified first packet includes a preamble, and wherein the process performed by the processor further includes setting a bit of the preamble to indicate that the second packet includes the unprotected portion.

19. The computing device of claim 16 wherein performing the anti-coding operation includes:
determining if the second packet is to be protected; and
in response to determining that the second packet is to be unprotected, performing the anti-coding operation on a portion of the copy of the first packet to generate the modified first packet with the anti-coding portion.

20. The computing device of claim 16 wherein performing the anti-coding operation includes:
determining if the second packet is to be protected;
in response to determining that the second packet is to be unprotected, performing the anti-coding operation on a portion of the copy of the first packet to generate the modified first packet with the anti-coding portion; and
in response to determining that the second packet is to be protected,
skipping performing anti-coding operation on a portion of the copy of the first packet, and
performing a coding operation on the copy of the first packet without the anti-coding portion to generate the second packet.

* * * * *